United States Patent
Toda et al.

(10) Patent No.: US 6,510,101 B2
(45) Date of Patent: *Jan. 21, 2003

(54) CLOCK-SYNCHRONOUS SEMICONDUCTOR MEMORY DEVICE

(75) Inventors: Haruki Toda, Kanagawa-ken (JP); Hitoshi Kuyama, Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/983,383

(22) Filed: Oct. 24, 2001

(65) Prior Publication Data

US 2002/0021617 A1 Feb. 21, 2002

Related U.S. Application Data

(63) Continuation of application No. 09/435,627, filed on Nov. 8, 1999, now Pat. No. 6,310,821, which is a continuation of application No. 09/113,570, filed on Jul. 10, 1998, now Pat. No. 5,986,968, which is a division of application No. 08/457,165, filed on Jun. 1, 1995, now Pat. No. 5,818,793, which is a continuation of application No. 08/031,831, filed on Mar. 16, 1993, now abandoned.

(30) Foreign Application Priority Data

Mar. 19, 1992 (JP) .............................. 4-063844

(51) Int. Cl.[7] .................................................. G11C 8/00
(52) U.S. Cl. .................. 365/233; 365/194; 365/189.01; 365/236
(58) Field of Search ................................. 365/233, 194, 365/189.01, 236

(56) References Cited

U.S. PATENT DOCUMENTS

| 4,330,852 A | 5/1982 | Redwine et al. ............. 365/221 |
|---|---|---|
| 4,819,213 A | 4/1989 | Yamaguchi et al. ......... 365/233 |
| 4,849,937 A | 7/1989 | Yoshimoto ................... 365/233 |
| 4,956,820 A | 9/1990 | Hashimoto ................... 365/222 |
| 5,054,000 A | 10/1991 | Miyaji .................... 365/230.03 |

(List continued on next page.)

FOREIGN PATENT DOCUMENTS

| EP | 0 211 565 | 2/1987 |
| EP | 0 260 897 | 3/1988 |
| EP | 0 284 985 | 10/1988 |
| EP | 0 315 194 | 5/1989 |
| JP | 62-223891 | 10/1987 |
| JP | 63-272191 | 11/1988 |
| JP | 2-250132 | 10/1990 |
| JP | 5-2873 | 1/1993 |
| JP | 5-120114 | 5/1993 |
| JP | 6-60640 | 3/1994 |
| WO | WO 92/09083 | 5/1992 |

OTHER PUBLICATIONS

Ohno, Chikai, "Self–Time RAM: STRAM", *Fujitsu Sci. Tech. J.*, 24, Dec. 4, 1988, pp. 293–300.

Dunn, E.C. et al., "Single Counter Controlled Buffer", *IBM Technical Disclosure Bulletin*, vol. 20, No. 5, Oct. 1977, pp. 1702–1703.

*Primary Examiner*—Vu A. Le
(74) *Attorney, Agent, or Firm*—Foley & Lardner

(57) ABSTRACT

A semiconductor device includes a memory cell array, a control section and latency setting circuit. The control section configured to receive a clock signal and a first control signal, and configured to output a plurality of the data in synchronism with the clock signal after the first control signal is asserted, output of the data beginning a number of clock cycles (latency N) of the clock signal (latency N being a positive integer $\geq 2$) after the first control signal is asserted, a different one of the data being output at each of the clock cycles after the output begins until the plurality of data is output. The latency setting circuit sets the latency N. The latency setting circuit includes at least one switch which permanently fixes a latency.

21 Claims, 8 Drawing Sheets

U.S. PATENT DOCUMENTS

| | | | |
|---|---|---|---|
| 5,058,074 A | 10/1991 | Sakamoto | 365/236 |
| 5,142,637 A | 8/1992 | Harlin et al. | 395/425 |
| 5,148,523 A | 9/1992 | Harlin et al. | 395/164 |
| 5,148,524 A | 9/1992 | Harlin et al. | 395/166 |
| 5,235,545 A | 8/1993 | McLaury | 365/230.08 |
| 5,268,865 A | 12/1993 | Takasugi | 365/233 |
| 5,295,115 A | 3/1994 | Furuya et al. | 365/230.08 |
| 5,305,277 A | 4/1994 | Derwin et al. | 365/230.02 |
| 5,311,483 A | 5/1994 | Takasugi | 365/233 |
| 5,313,437 A | 5/1994 | Toda et al. | 365/236 |
| 5,323,358 A | 6/1994 | Toda et al. | 365/230.09 |
| 5,341,341 A | 8/1994 | Fukuzo | 365/230.08 |
| 5,343,438 A | 8/1994 | Choi et al. | 365/233 |
| 5,390,149 A | 2/1995 | Vogley et al. | 365/189.01 |
| 5,500,829 A | 3/1996 | Toda et al. | 365/230.08 |
| 5,587,954 A | 12/1996 | Vogley et al. | 365/221 |
| 5,587,963 A | 12/1996 | Toda et al. | 365/236 |
| 5,612,925 A | 3/1997 | Toda et al. | 365/236 |
| 5,798,979 A | 8/1998 | Toda et al. | 365/233 |
| 5,818,793 A | 10/1998 | Toda et al. | 365/233 |

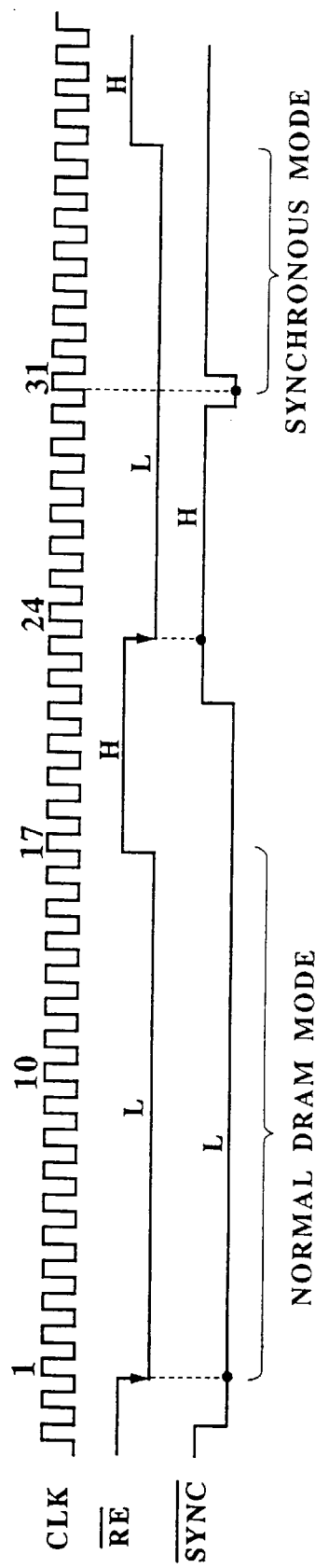
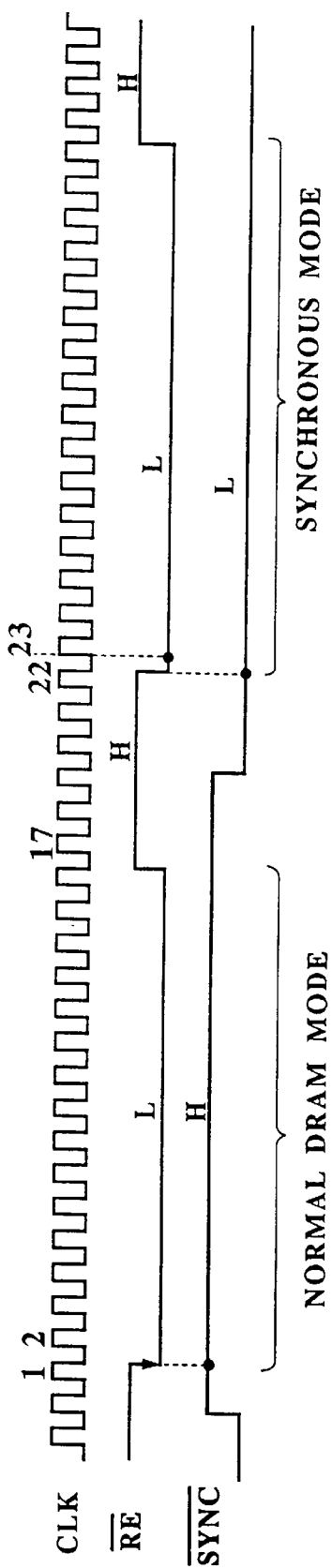

CLOCK-SYNCHRONOUS SEMICONDUCTOR MEMORY DEVICE

CROSS-REFERENCE TO RELATED PATENT APPLICATIONS

Japan Priority Application 04-063844, filed Mar. 3, 1992 including the specification, drawings, claims and abstract, is incorporated herein by reference in its entirety. This application is a Continuation of U.S. application Ser. No. 09/435,627, filed Nov. 8, 1999 now U.S. Pat. No. 6,310,821, incorporated herein by reference in its entirety, which is a Continuation of U.S. application Ser. No. 09/113,570, filed Jul. 10, 1998 now U.S. Pat. No. 5,986,968, incorporated herein by reference in its entirety, which is a Division of U.S. application Ser. No. 08/457,165, filed Jun. 1, 1995 now U.S. Pat. No. 5,818,793, incorporated herein by reference in its entirety, which is a File Wrapper Cont. of U.S. application Ser. No. 08/031,831, filed Mar. 16, 1993 now abandoned, incorporated herein by reference in its entirety.

BACKGROUND OF THE INVENTION

1. Field of the Invention

The present invention relates to a clock-synchronous semiconductor memory device and access method thereof which operates synchronously with a basic clock signal, and, in particular, to a clock-synchronous semiconductor memory device and access method thereof in which an address for accessing can be set synchronously with a basic clock signal, and a clock-synchronous semiconductor memory device and access method thereof in which an address for accessing can be set when a high-frequency basic clock signal is used.

2. Description of the Prior Art

The inventors of the present invention have previously proposed a basic method for controlling a memory operation for a semiconductor memory device synchronized with a basic clock signal (Japan Application No. 3-255354).

At that time, several methods were illustrated for controlling a memory access by means of an external control signal, but nothing was disclosed how to set a external control signals synchronously with a basic clock signal and with respect to setting specific timing for an address signal or the like for the external control signals.

Moreover, there is a problem that it is difficult to access data when a high-frequency basic clock signal is used in a conventional a clock-synchronous semiconductor memory device and access method thereof.

BRIEF SUMMARY OF THE INVENTION

According to an aspect of the present invention, there is provided a semiconductor device comprising a memory cell array having memory cells arranged in rows and columns, the memory cells storing data and being selected according to address signals; control section configured to receive a clock signal and a first control signal, and configured to output a plurality of the data in synchronism with the clock signal after the first control signal is asserted, output of the data beginning a number of clock cycles (latency N) of the clock signal (latency N being a positive integer ≧2) after the first control signal is asserted, a different one of the data being output at each of the clock cycles after the output begins until the plurality of data is output, and a latency setting circuit configured to set the latency N, the latency setting circuit including at least one switch which permanently fixes a latency.

BRIEF DESCRIPTION OF THE DRAWINGS

FIG. 3 is a chart showing an example of external signal waveforms for switching between a normal access mode and the clock synchronous mode of the present invention.

FIG. 4 is a chart showing an example of external signal waveforms for switching between a normal mode and a conventional clock synchronous mode according to the present invention.

DETAILED DESCRIPTION OF THE PREFERRED EMBODIMENTS

The features of this invention will become apparent in the course of the following description of exemplary embodiments which are given for illustration of the invention and are not intended to be limiting thereof.

Preferred embodiments of the present invention will now be explained with reference to the drawings.

This example will be explained using a timing chart illustrated in FIG. 1.

Figure 1:
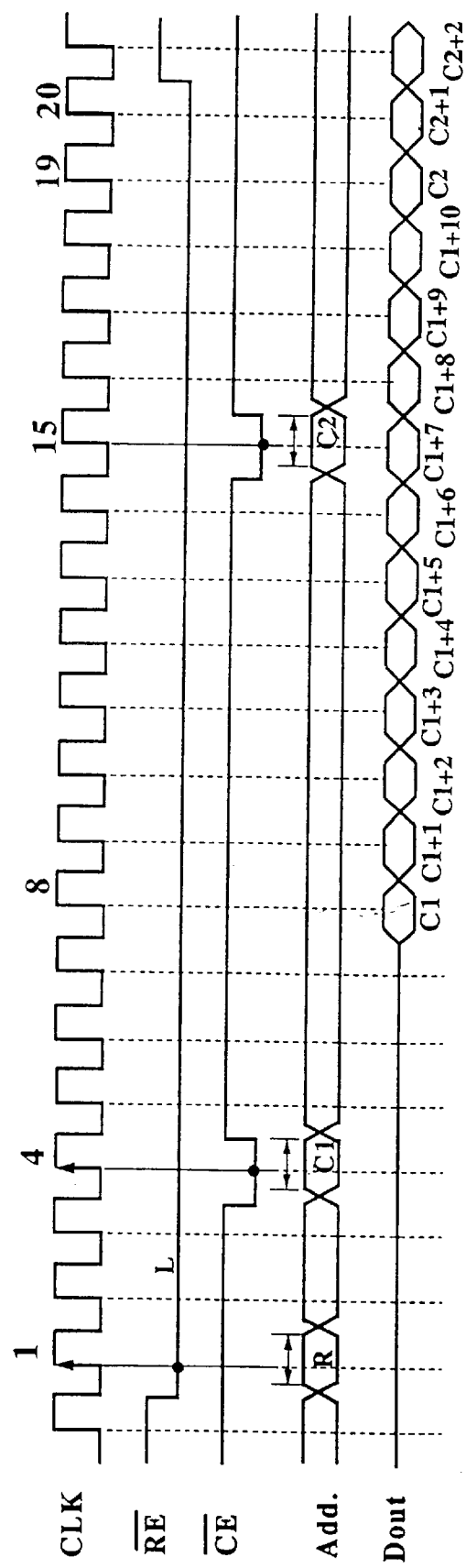
FIG. 1 is an external signal waveform diagram showing a clock-synchronous operation of a clock-synchronous semiconductor memory device relating to an access method according to the first embodiment of the present invention.

In the timing chart of FIG. 1, all of the signals are set with respect to the transition of the rising edge of the basic clock signal CLK. For example, at a first clock cycle CLK1, an external signal /RE, which is provided from external device, is switched to the "L" level, and a so-called row address which designates a row in a memory cell array is introduced. Accordingly, the setting of the conditions of this address, as shown in the drawing, is asserted based on the rising edge of the basic clock signal CLK.

In the same manner, a column address designating a column in the memory cell array is based on the transition of the falling edge of a clock cycle (CLK4) of the basic clock signal CLK when the external control signal /CE is at "L" level, specified as shown in the drawing.

In a data output operation, for example, a series of access operations is carried out in three clock cycles, and at the fourth cycle (CLK8) data (C1) is output to the outside from the chip in which a semiconductor memory device is formed.

In changing the column address during the course of the serial output, a cycle in which the Column Enable signal /CE as a control signal is at "L" level is made, and the column address is set in the same manner with respect to the timing of the transition of the rising edge (CLK15) of this basic clock signal. After the four cycles later from the setting (CLK19), data is output serially in a predetermined order (C2, C2+1, C2+2, ...), in which the data at a new column address is output at first.

The case will be considered where the basic clock signal period is short, for example, about 10 ns. In this case, it is difficult to set an address from a particular cycle synchronous with this basic clock signal CLK, while reliably setting the set-up and holding time for maintaining the conditions of the address signal, based on the transition of the rising edge of one cycle of the basic clock signal CLK. Specifically, it is difficult, counting from the next cycle, to select the specified cycle and to set the address within that cycle.

In addition, from an aspect of a circuit operation, it is difficult to specify a cycle and reliably input an address signal or the like in this cycle, then operate this circuit stably with good reliability when the period of the basic clock signal CLK is short. Strict timing control is necessary for both the system aspect side and the chip aspect side, and a complicated circuit design is required to provide this.

Moreover, in the case of a system where the period of the basic clock signal CLK is long, when the memory chip normally performs an internal operation at a specified cycle following the setting cycle for the column address, a large amount of access time is necessary for accessing the head when accessing from a newly-set column address.

In this manner, when an operating method utilizing a basic clock signal CLK is uniform, or more specifically, invariable, the system cycle time is unchangeable to a certain degree.

There is therefore the problem that this operating method is difficult to apply in practice to a system in a range which can efficiently utilize the cycle.

To solve the problem, the second preferred embodiment of the present invention will now be explained.

There is a case that it is difficult to set an address in one cycle synchronous with a basic clock signal CLK when the cycle time is short.

Figure 2:
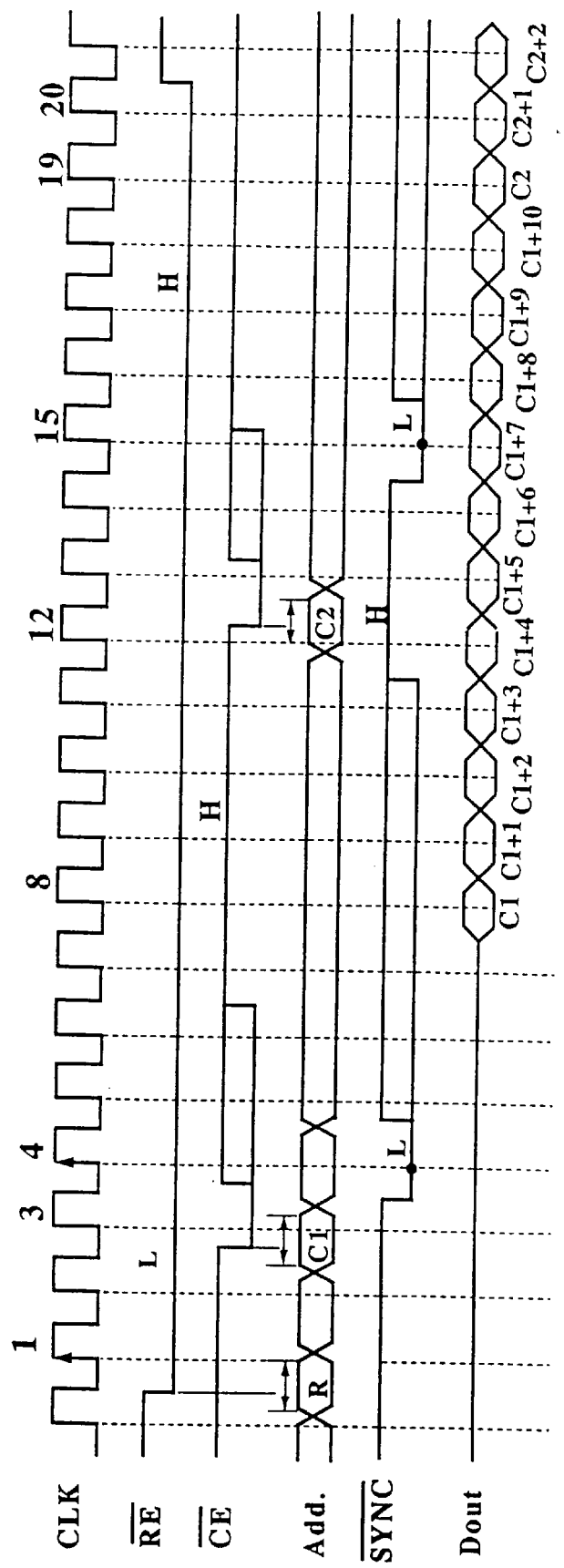
FIG. 2 is an external signal waveform diagram for an address-incorporated nonsynchronous-type of clock-synchronous method for a clock-synchronous semiconductor memory device relating to an access method which is another embodiment of the present invention.

One method of avoiding this is provided in the embodiment of the present invention shown in FIG. 2.

In this drawing, first, when a Row Enable control signal /RE is at "L" level (immediately prior to a signal CLK1), the operation for introducing the address is activated. However, at this time, the address operation inside a semiconductor memory device synchronized with the basic clock signal CLK has not yet started. The input of this address is the same as setting by means of a conventional DRAM, and in the setting of the address there are no occasional difficult areas. Specifically, the address can be introduced without restriction in the timing of the basic clock. In this manner, the address is set by means of the Row Enable control signal /RE and a Column Enable control signal /CE (which are referred to as first control signals in claim 2), and actual data access for an address introduced into memory synchronized with the basic clock signal CLK is commenced by means of a control signal /SYNC as an external second control signal. If the control signal /SYNC is at "L" level (CLK4) when the transition of the onset of the clock signal, it enters the synchronous mode from that cycle, and an internal access operation proceeds synchronous with the basic clock signal.

As a result, the output of data C1 to the outside begins at the commencement of a synchronized operation (CLK4) in this embodiment at the fourth cycle (CLK8). To change the column address during serial access, with the control signal /SYNC at "H" level (CLK12), a new column address C2 is introduced asynchronously with the basic clock signal, and an address is set and introduced at the falling edge of the control signal /CE (CLK12). Next, the control signal /SYNC is once again switched to "L" level (CLK15) and synchronized access commences at this new address.

In FIG. 2, access to a new column address starts from CLK15, and a switch from address C1 to address C2 is made from CLK19 after four cycles.

On further expanding this concept, it is possible to provide a semiconductor memory device in which an operation mode can be set for each cycle which sets a row address. The operation mode in this case means data output timing and is defined as either a basic clock signal synchronized access mode (hereinafter synchronous mode) wherein the data output is accessed in synchronism with a state of the basic clock signal CLK after addresses to be accessed are set or a mode in which data output is started after addresses to be accessed are set like a conventional DRAM (hereinafter we call the mode "a normal mode").

FIG. 3 and FIG. 4 are charts showing a method of switching between these two modes.

FIG. 3 illustrates a method for switching between a conventional normal mode and the synchronous mode of the present invention explained in the second embodiment shown in FIG. 2. The control signal /SYNC is used as a control signal for this switching. If this control signal /SYNC is at "L" level when the control signal /RE falls (CLK1), the normal mode is in effect; if at "H" level, it is the same as the normal mode for address input operation, but the synchronous mode is effected only when the control signal /SYNC is fallen (CLK31). This is an example for the synchronous mode in the present invention.

FIG. 4 shows the case of switching between a conventional normal mode and the synchronous mode illustrated in the first embodiment shown in FIG. 1. In this case, for example, the control signal /SYNC is used, and the condition of the control signal /SYNC when the control signal /RE falls determines whether the normal mode or the synchronous mode is entered.

In FIG. 4, the normal mode occurs when the control signal /SYNC is at "H" level; and the synchronous mode occurs when the control signal /SYNC is at "L" level (CLK22). When the control signal /RE is at the "L" level, synchronous operation commences from the first clock signal (CLK23). In the switch to this mode, It is obvious that, even when the control signal /SYNC is not used, the mode setting cycle may be set separately.

In any of the above cases, because it is possible to provide for a conventional normal mode and a synchronous mode of the present invention by using a time sharing method in the same semiconductor memory device, this method is effective in the case where random access and high speed serial access are required in the same semiconductor memory device.

Next, a case will be explained in which the basic clock signal CLK of the system is not necessarily produced at maximum speed. If at a cycle time of 10 ns there is efficient synchronous memory control, while at a cycle time of 20 ns the operation within the memory remains unchanged, the initial access after setting the column address requires twice the time.

Also the time to spare for the operation within the memory becomes large so that there is considerable time during which the operation is idle.

In order to avoid this and achieve an efficient memory operation, it is desirable that the cycle of the internal operation be capable of modification according to the cycle length of the basic clock signal CLK used.

Figure 5:
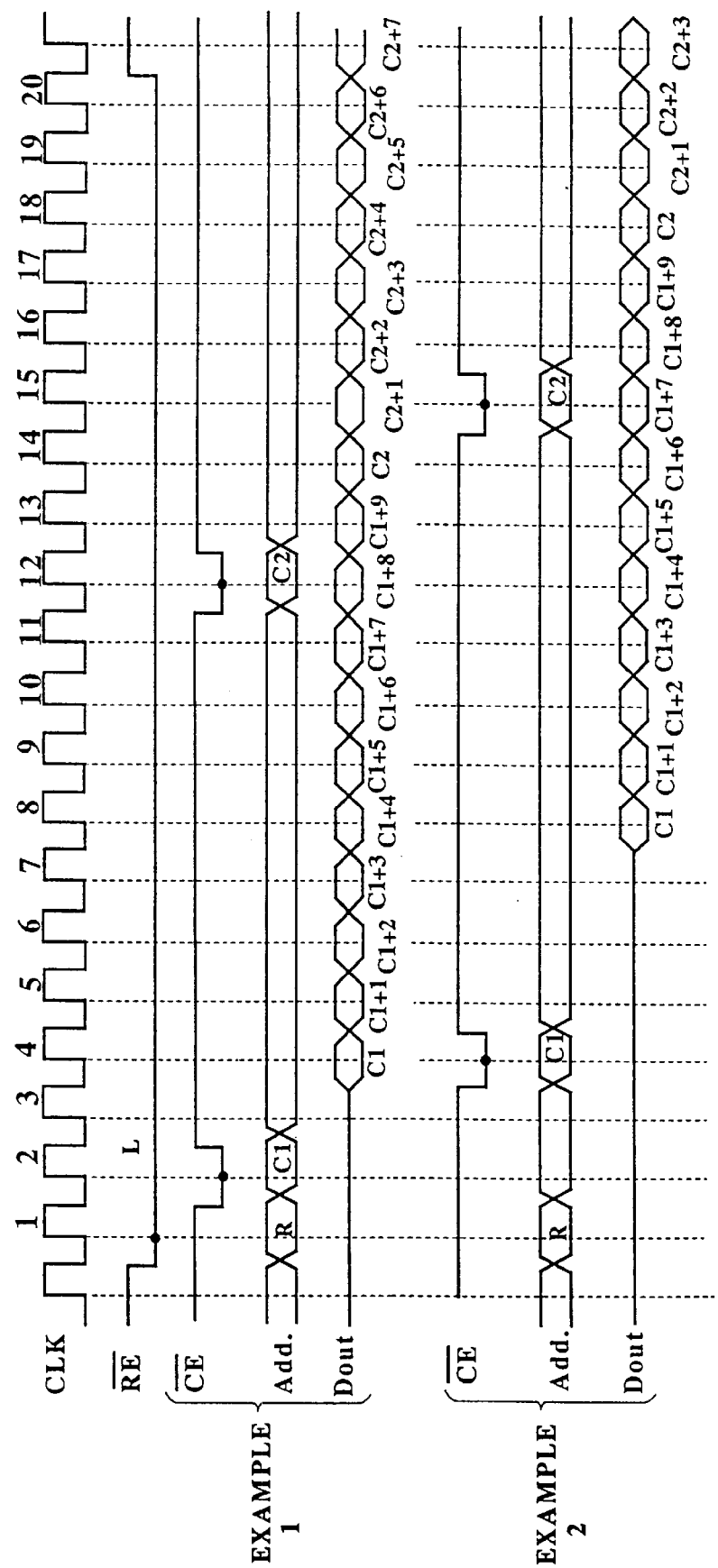
FIG. 5 is a chart comparing external waveforms in the case of modifying the number of clock cycles used in the internal operation, within the same memory.

FIG. 5 is a timing chart showing an example of an access timing method with the above-mentioned type of function. This chart shows two cases, each with a different number of cycles required for the internal operation. Also, an example of a conventional type of synchronous mode is illustrated in order to make the explanation more easily understandable.

Example 2 in FIG. 5 illustrates the case where the number of cycles of the synchronous operation corresponds to the first embodiment shown in FIG. 1.

Example 1 in FIG. 5 corresponds to a case in which the number of cycles of the synchronous operation Is decreased. In this case, an operation following the internal operation of example 1 cannot be carried out at a short period for a basic clock cycle the same as example 2, but the chart shows two cases with respect to the same clock cycle in order to observe the difference in the number of control cycles. In example 1, the internal operation is performed in half the number of cycles of example 2. Accordingly, in practice, example 2 relates to control of a system in which the period of the basic clock signal is a 10 ns cycle, while example 1 shows a system control method for a 20 ns cycle.

An optimum operation is performed with both these systems. Another embodiment of the present invention will now be explained.

A configuration of a clock-synchronous semiconductor memory device which can execute the access methods shown in FIGS. 1 to 5 described above will be explained referring to FIG. 6.

Figure 6:
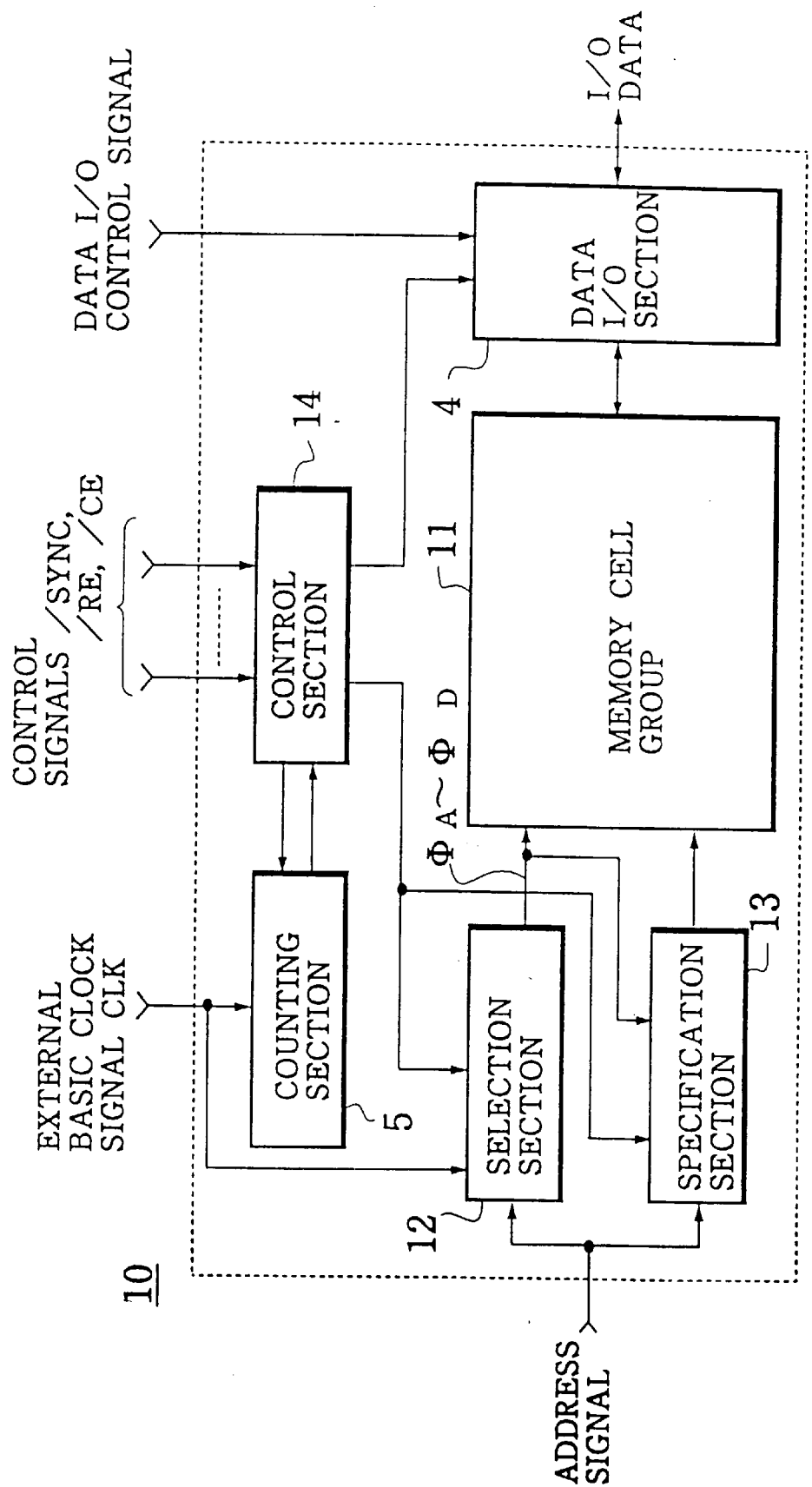
FIG. 6 is a configuration diagram for a clock-synchronous semiconductor memory device of the present invention which is capable of executing the access methods shown in FIGS. 1 to 5.

FIG. 6 shows the configuration of the clock-synchronous semiconductor memory device 10 which can execute effectively the access methods of the present invention.

As one of basic operation of the semiconductor memory device 10, a memory access operation of the semiconductor memory device 10 is carried out based on an external basic clock signal CLK and at least one or more external control signals which are provided continuously to the semiconductor memory device.

In FIG. 6, a memory device 10 comprises a counting section 5 and a control section 14, which are main control elements of the semiconductor memory device, in addition to a memory cell group 11, a selection section 12, a specification section 13.

A dynamic memory cell, a static memory cell, or the non-volatile memory cell of the memory cell group 11 is arranged in the form of a matrix.

The data which is written in and read out is stored in this memory cell.

The data access is carried out between the memory cell group 11 and external devices (not shown) through a data I/O section 4.

The specification section 13 sets consecutive addresses in the memory cell group 11 according to a series of externally-provided address signals under the control of the control section 14, and designates, in order, the memory cells which are to be accessed. Under the control of the control signals /SYNC, /RE, and /CE input into the control section 14, the specification section 13, for example, fetches a row address signal, then fetches a series of column address signals for a string of memory cells in the memory cell group 11 connected to a word line designated by the row address signal. The specification section 13 designates a series of memory cells consecutively by means of the column address signal.

The data I/O section 4 performs a read or write operation on the memory cell group 11 designated by the specification section 13 based on a read/write signal obtained externally.

The read-out data is output to an external destination through the data I/O section 4. The data to be stored is provided to the designated memory cell from an external source through the data I/O section 4 by the specification section 13.

The counting section 5 is a counter for counting the number of cycles of the basic clock signal CLK continuously input at an almost fixed frequency from an external source.

The counter 5 is capable of counting a fixed number of clock cycles of the basic signal CLK and discriminating some clock cycles from other cycles. A circuit essentially having the function can be considered as the counter 5. Therefore a circuit having the function described above can be used instead of the counter 5 when there is the circuit in the semiconductor memory device 10.

The external basic clock signal CLK used in this embodiment is a clock signal with a cycle time of, for example, less than the 30 ns access time of the memory device. The counting section 5 provides the control section 14 with the count of the number of cycles of the clock signal CLK.

The control section 14 sends a selection signal to the selection section 12 based on the level of the control signal /SYNC provided from external.

Based on the selection signal, the selection section 12 selects the access timing of the memory cell group 11, then sends address activation signal ϕA to ϕD to the memory cell group 11.

The selection section 12 selects either the normal operation mode or the synchronous operation mode which have been already explained and shown in FIGS. 3 and 4 under the control of the control section 14.

When the selection section 12 is not included in the semiconductor memory device 10, the semiconductor memory device performs only the access methods shown in FIGS. 1 to 4.

Configurations of the counting section 5 and the control section 14 will be described below referring to FIGS. 7 to 10.

Generally, the internal operation is basically controlled with a minimum unit of operation time corresponding to a basic clock signal CLK. Accordingly, the number of basic clock cycles it takes to carry out a series of operations can be selectively determined by controlling the transmission to the section of the circuit in which this operation is carried out, using a number of cycles for a signal to start a certain operation.

FIGS. 7 to 10 show examples of configurations of circuits by which this selection can be set by using an external laser to blow a fuse inside a chip.

Figure 7:
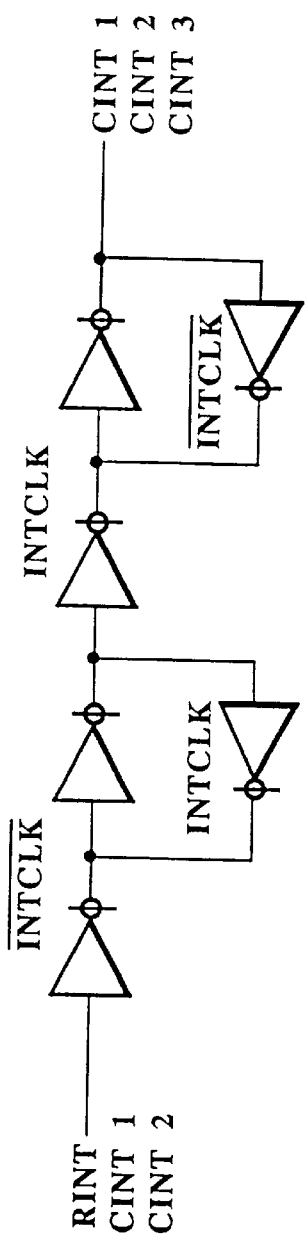
FIG. 7 is a diagram of a clock-synchronous delay circuit for an internal circuit drive signal.

FIG. 7 shows an example in which a trigger signal RINT for a certain circuit is delayed only for a time corresponding to a number of parts of the cycles of the basic clock signal CLK. This circuit is a so-called shift register circuit, and transmission is carried out successively in the state where the signal RINT is at the "H" level, according to the change in a signal INTCLK inside the chip, synchronized with the basic clock signal CLK. INTCLK and /INTCLK are of opposite phases. In FIG. 7, when /INTCLK is at the "H" level, a signal in a latch circuit of the previous step is transmitted, and when INTCLK is at the "H" level, a signal in a latch circuit of the following step is transmitted.

Accordingly, a delay circuit in FIG. 7 produces a signal delay at one part of the basic clock cycle, and the signal RINT is delayed by one cycle and output as a signal CINT1.

Figure 8:
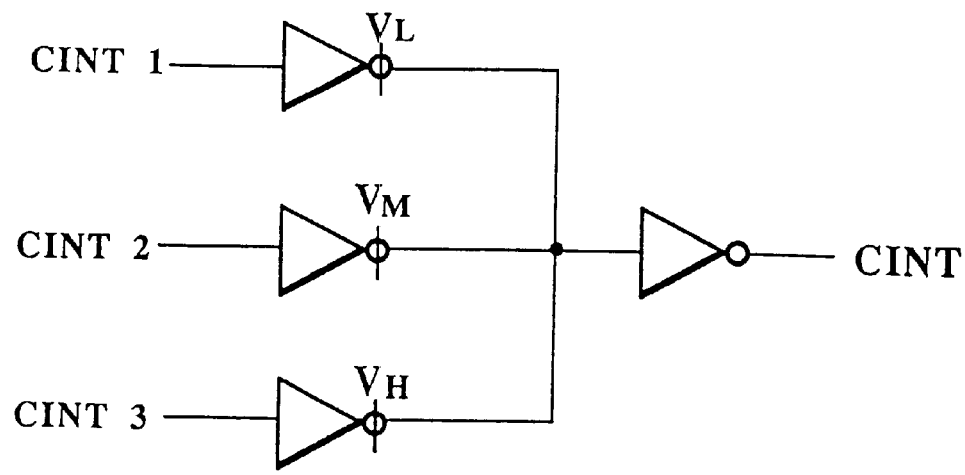
FIG. 8 is a circuit diagram for a delayed signal selection switching circuit.
Figure 11:
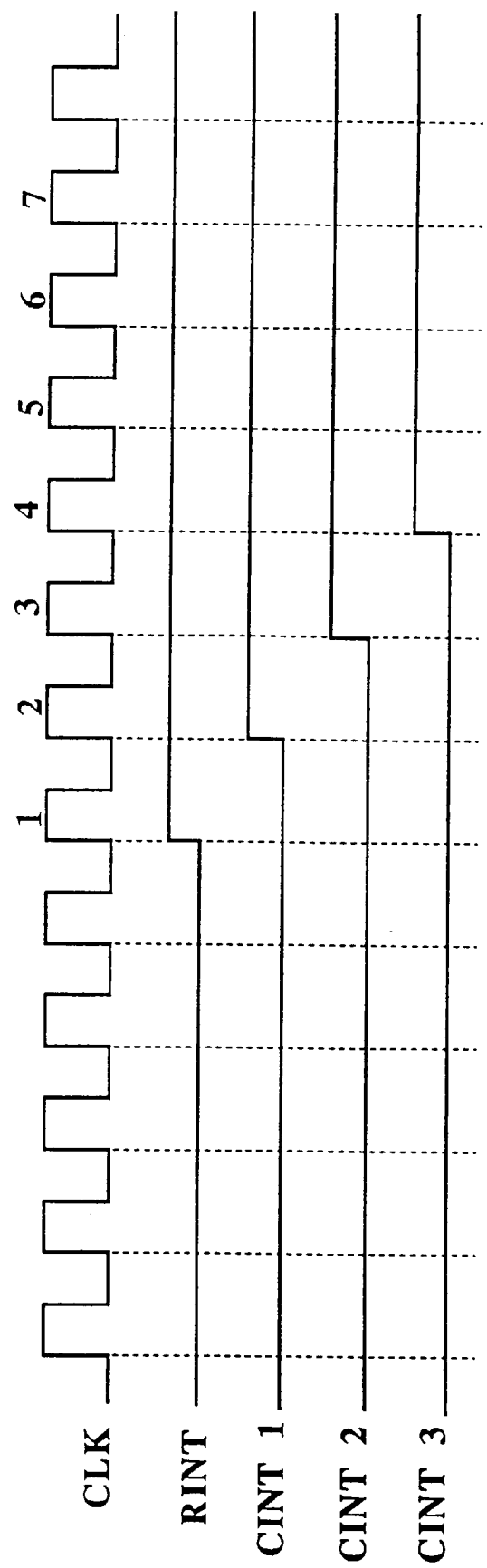
FIG. 11 is a waveform diagram showing the relationship between each delayed signal in FIG. 8 and the basic clock cycle.

In addition, by passing through the same type of circuit, CINT2 is produced which is a delay of one cycle from CINT1, and CINT3 is produced which is a delay of one cycle from CINT2. In a clocked invertor such as shown in FIGS. 7 and 8, the circuit acts as an inventor at the "H" level signal expressed at the output part and at the "L" level signal expressed at the output part, and the output becomes a high impedance and is isolated from a node portion proceeding the output. The relation of the basic clock cycle to the signal is shown in FIG. 11. In this chart, a plurality of signals CINT1, CINT2, and CINT3 is shown, each of which onsets at the respective cycles CLK2, CLK3, and CLK4, which are successively one cycle delayed respectively from the signal RINT which is risen at the signal CLK1. Depending on which of these signals is used, it is possible to specify at which cycle following a prescribed cycle in the basic clock signal certain, operations, for example, I/O operations, will be performed. When observed from a basic configuration portion of a synchronous-type memory, these delayed circuits can be considered as forming counters for the basic clock cycle.

FIG. 8 is a diagram showing a part which selects any delayed signal and supplies this signal to a driven circuit as the signal CINT used in actual control. From the action of the clocked inventor, the signal output as the output signal CINT when VL is at the "H" level is CINT1; when VM is at the "H" level—CINT2; and when VH is at the "H" level—CINT3. The circuit used as the switch, if switched in accordance with the period of the basic clock signal CLK of the system using the memory, can cause the optimum operation to be performed in the system.

Several methods for creating the signal for switching can be considered. Blowing a fuse; modifying a mask pattern for a process for including a wiring layer in the memory IC; a method by which an internal node is given either a floating or a fixed potential using bonding from a power source line pin, which has the same effect as blowing a fuse; a method for distinguishing whether a pin used as a non-connected pin is connected to the power source or is floating, or the like; a programming method for distinguishing the condition of another external signal at the timing when the control signal /RE falls or the like; are examples which can be given.

Figure 9:
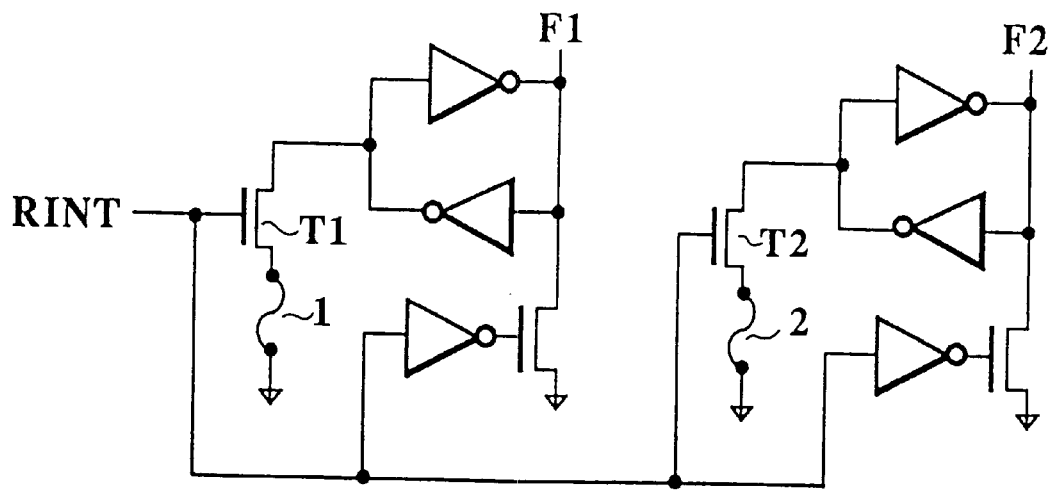
FIG. 9 is a circuit diagram for a blown fuse signal generating circuit.

The following explanation covers a specific case using the blowing of a fuse. FIG. 9 is a diagram showing a circuit for creating a combination of four signal conditions by blowing two fuses. In the case where neither a fuse 1 or a fuse 2 is blown, a signal F1 and a signal F2 are set at the "L" level until the onset of the signal RINT, then, at the onset of the signal RINT both the signals F1 and F2 rise to the "H" level.

On the other hand, when a fuse is blown, because a transistor T1 or a transistor T2 does not become a pass connected to ground or earth, the signal F1 or the signal F2 is maintained at the latch level and is held at the "L" level even on the onset of the signal RINT.

According to the method of blowing the fuses 1, 2, there are four ways in which conditions of the signals F1 and F2 can be combined.

Figure 10:
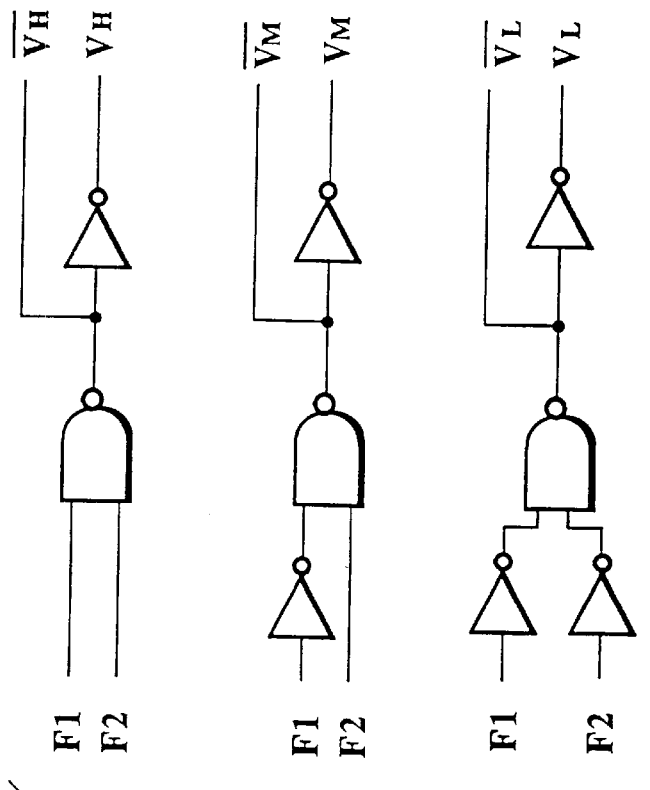
FIG. 10 is a circuit diagram for a circuit for generating a drive signal for a delayed signal selection switching circuit.

Three of these four ways for creating a signal for input to the switching circuit of FIG. 8, are illustrated by the circuits shown in FIG. 10. The circuits shown in FIG. 10 are logical circuits for creating the signals VH, VM, and VL from the signals F1 and F2 produced by the combination of the blow of the fuses when the signal RINT is at the "H" level. If neither of the fuses 1 and 2 in the circuits explained above is blown, VH is switched to the "H" level and the onset of the signal CINT occurs at the fourth cycle from the onset of the signal RINT. If the fuse 1 only is blown, VM is switched to the "H" level and the onset of the signal CINT occurs at the third cycle from the onset of the signal RINT. When both fuses are blown, VL is switched to the "H" level and the onset of the signal CINT occurs at the second cycle from the onset of the signal RINT.

In the case where the fuse 2 only is blown, none of the signals onsets, therefore, the signal CINT does not onset.

In all methods such as modifying a mask pattern for a process for introducing another wiring layer in the memory IC; a method using bonding from a power source line pin to a pad for an internal node in place of a fuse, and a method for distinguishing whether a pin used as a non-connecting pin is connected to the power source or is floating, or the like, the structure and the method for grounding the corresponding node of the transistors T1, T2 in place of the fuses 1, 2 can be easily inferred by one skilled in the art. These particulars are self-evident, therefore further explanation will be omitted here.

On the other hand, in a programming, method for distinguishing the condition of several external signals at the timing when the control signal /RE falls, or the like, signals corresponding to the signals F1, F2 are created directly by the internal logic. If the corresponding relationship with the external signal condition is set, it is possible to easily fabricate a logic circuit so that a signal corresponding to F1 and F2, or VH, VM and VL is generated during that condition.

As explained in the foregoing, with the clock-synchronous semiconductor memory device of the present invention, for example, in the case where the address is set in synchronism with the basic clock signal CLK after the control signals /RE and /CE are input, memory access operation can be carried out accurately.

Further, for example, in the case where the period of the basic clock signal CLK for the system is short, it is possible to set an address value using a method unrelated to the length of the period of the basic clock cycle. Accordingly, the design of the system timing and the prerequisites relating to the internal memory operations becomes easier, even in the case where the period of the clock cycle is short.

Further, with respect to access of data, the present invention takes advantage of the special feature of the clock synchronous method of access.

In addition, when random access such as the page mode of a conventional DRAM is necessary, and also in the case where the system is based on a circuit structure in which high speed serial access is synchronous with the clock cycle, it is possible to switch between DRAM mode and synchronous mode on the same chip through time-sharing. Therefore, if other methods are used in the present invention, the system can be efficiently constructed.

In particular, it can be applied in practice to an image memory. Furthermore, in order to cope with optimum operation of memory in systems with various periods shown in other embodiments, it is possible to modify the number of cycles used for the data access operation of the memory, therefore, it is possible to design a single memory for application to many systems. For this reason, a memory can be selected which can demonstrate system performance of maximum scope.

Thus, it is possible to certainly set an address to be accessed, in spite of the length of a period of a basic clock signal, and to output data accurately by the clock-synchronous semiconductor memory device and access methods thereof according to the present invention.

What is claimed is:

1. A semiconductor device comprising:
    a memory cell array having memory cells arranged in rows and columns, said memory cells storing data and being selected according to address signals;
    a control section configured to receive a clock signal and a first control signal, and configured to output a plurality of said data in synchronism with said clock signal after said first control signal is asserted, output of said data beginning a number of clock cycles (latency N) of said clock signal (latency N being a positive integer ≧2) after said first control signal is asserted, a different one of said data being output at each of said clock cycles after said output begins until said plurality of data is output, and
    a latency setting circuit configured to set the latency N, said latency setting circuit including at least one switch which permanently fixes a latency.

2. The semiconductor device according to claim 1, wherein said at least one switch is a fuse, and said latency setting circuit sets the latency N in accordance with a blow/non-blow condition.

3. The semiconductor device according to claim 2, wherein said fuse is selectively blown in the middle of a manufacturing process.

4. The semiconductor device according to claim 1, wherein said at least one switch includes terminals to which a wiring layer is connected, and said latency setting circuit sets the latency N based on whether or not said wiring layer is formed and said terminals are electrically connected to one another.

5. The semiconductor device according to claim 4, wherein, in a metalization process of a manufacturing process of said semiconductor device, said wiring layer is changed by modifying a mask pattern.

6. The semiconductor device according to claim 1, wherein said at least one switch is terminals on which a wire bonding is performed, and said latency setting circuit sets the latency N based on whether or not a wire bonding is performed and said terminals are electrically connected to one another.

7. The semiconductor device according to claim 6, wherein said wire bonding is performed in a packaging process of said semiconductor device.

8. A semiconductor device comprising:
    a memory cell array having memory cell sections, each of the memory cell sections having memory cell arrays with memory cells arranged in rows and columns, said memory cells storing data and being selected according to address signals;
    a control section configured to receive a clock signal and a first control signal, and configured to output a plurality of said data in synchronism with said clock signal after said first control signal is asserted, output of said data beginning a number of clock cycles (latency N) of said clock signal (latency N being a positive integer ≧2) after said first control signal is asserted, a different one of said data being output at each of said clock cycles after said output begins until said plurality of data is output, and
    a latency setting circuit configured to set the latency N, said latency setting circuit including at least one switch which permanently fixes a latency.

9. The semiconductor device according to claim 8, wherein said at least one switch is a fuse, and said latency setting circuit sets the latency N in accordance with a blow/non-blow condition.

10. The semiconductor device according to claim 9, wherein said fuse is selectively blown in the middle of a manufacturing process.

11. The semiconductor device according to claim 8, wherein said at least one switch includes terminals to which a wiring layer is connected, and said latency setting circuit sets the latency N based on whether or not said wiring layer is formed and said terminals are electrically connected to one another.

12. The semiconductor device according to claim 11, wherein, in a metalization process of a manufacturing process of said semiconductor device, said wiring layer is changed by modifying a mask pattern.

13. The semiconductor device according to claim 8, wherein said at least one switch is terminals on which a wire bonding is performed, and said latency setting circuit sets the latency N based on whether or not a wire bonding is performed and said terminals are electrically connected to one another.

14. The semiconductor device according to claim 13, wherein said wire bonding is performed in a packaging process of said semiconductor device.

15. A memory system comprising:
    a semiconductor memory device including an internal circuit which is controlled to perform memory access operation in response to a clock signal, a first control signal and a latency control signal, and
    signal input section inputting said clock signal, said first control signal and said latency control signal to said semiconductor memory device, said signal input section being arranged outside of said semiconductor memory device,
    wherein said semiconductor memory device including:
        a memory cell array having memory cells arranged in rows and columns, said memory cells storing data and being selected according to address signals;
        a control section configured to receive said clock signal and said first control signal, and configured to output a plurality of said data in synchronism with said clock signal after said first control signal is asserted, output of said data beginning a number of clock cycles (latency N) of said clock signal (latency N being a positive integer ≧2) after said first control signal is asserted, a different one of said data being output at each of said clock cycles after said output begins until said plurality of data is output, and
        a latency setting circuit configured to set the latency N, said latency setting circuit including at least one switch which permanently fixes a latency.

16. The memory system according to claim 15, wherein said at least one switch is a fuse, and said latency setting circuit sets the latency N in accordance with a blow/non-blow condition.

17. The memory system according to claim 16, wherein said fuse is selectively blown in the middle of a manufacturing process.

18. The memory system according to claim 15, wherein said at least one switch includes terminals to which a wiring layer is connected, and said latency setting circuit sets the latency N based on whether or not said wiring layer is formed and said terminals are electrically connected to one another.

19. The memory system according to claim 18, wherein, in a metalization process of a manufacturing process of said semiconductor device, said wiring layer is changed by modifying a mask pattern.

20. The memory system according to claim 15, wherein said at least one switch is terminals on which a wire bonding is performed, and said latency setting circuit sets the latency N based on whether or not a wire bonding is performed and said terminals are electrically connected to one another.

21. The memory system according to claim 20, wherein said wire bonding is performed in a packaging process of said semiconductor device.

* * * * *